United States Patent [19]
Lee et al.

[11] Patent Number: 5,640,036
[45] Date of Patent: Jun. 17, 1997

[54] HIGH VOLTAGE CUT-OFF SEMICONDUCTOR DEVICE

[75] Inventors: Woo Bong Lee; Taek Ki Hong; Tae Jung Yeo; Jae Wan Koh; Se Jeong Kim, all of Kyoungkido, Rep. of Korea

[73] Assignee: Hyundai Electronics Industries Co., Ltd., Kyoungkido, Rep. of Korea

[21] Appl. No.: 527,003

[22] Filed: Sep. 12, 1995

[30] Foreign Application Priority Data

Nov. 8, 1994 [KR] Rep. of Korea ............... 1994-29186

[51] Int. Cl.$^6$ ........................................ H01L 23/62
[52] U.S. Cl. .................. 257/355; 257/356; 257/357; 257/358; 257/360; 361/90; 361/91
[58] Field of Search .......................... 257/355–358, 257/360, 363; 361/90, 91

[56] References Cited

U.S. PATENT DOCUMENTS

| | | | |
|---|---|---|---|
| 4,271,445 | 6/1981 | Hartman et al. | 257/134 |
| 4,573,163 | 2/1986 | Henze et al. | 307/318 |
| 4,750,078 | 6/1988 | Ganger et al. | 257/360 |
| 4,855,892 | 8/1989 | Lower | 361/18 |
| 4,929,884 | 5/1990 | Bird et al. | 307/296.2 |
| 5,047,698 | 9/1991 | Fernsler et al. | 315/411 |
| 5,276,358 | 1/1994 | Merrill et al. | 257/603 |

OTHER PUBLICATIONS

Robert Bolestad et al. Electronic Devices and Circuit Theory, 3rd edition, 1982.

Primary Examiner—Wael Fahmy
Assistant Examiner—Fetsum Abraham
Attorney, Agent, or Firm—Keck, Mahin & Cate

[57] ABSTRACT

The present invention discloses a high voltage cut-off semiconductor device that can prevent unstable supply voltage of several volts that is not cut off by a conventional electrostatic discharge protection circuit from being applied to an internal circuit and apply only stable supply voltage to the internal circuit, thereby enhancing the characteristics of the semiconductor device and shortening the channel length of the transistors forming the internal circuit by suing a constant voltage circuit having a zener diode.

7 Claims, 2 Drawing Sheets

HIGH VOLTAGE CUT-OFF SEMICONDUCTOR DEVICE

BACKGROUND OF THE INVENTION (1) Field of the Invention

The invention relates to a semiconductor device for cutting off high voltage that can protect internal components of the semiconductor device from the shock generated by the high supply power Vcc.

(2) Description of the Prior Art

Generally, an electrostatic discharge protection circuit is employed between supply power terminal and internal circuit to protect the internal components of a semiconductor chip from unstable high voltage applied from the supply power terminal.

FIG. 1 is a block diagram of a conventional semiconductor chip, showing an electrostatic discharge protection circuit that each channel of thick film transistor T1 and thin film transistor T2 is formed between a current path and ground Vss on both sides of resistance R1 on the current path connecting a supply power Vcc 11 with an internal circuit 13.

The transistor T1 of the supply power terminal 11 which is a thick film transistor, can protect the internal circuit from external shock of more than tens volts but cannot do it from external shock of 7 to 10 V. In case that the stable supply voltage is 5 V in a conventional semiconductor chip, the chip is designed to protect its internal circuit against about the supply voltage of 8 V higher than 5 V, which leads to high threshold voltage of the semiconductor device to drop the performance speed of the device, and since it is not possible to shorten the channel length of this conventional device, high integration of the semiconductor device cannot be obtained according to this technique.

SUMMARY OF THE INVENTION

It is an object of the invention to provide a semiconductor device for cutting off high voltage that can prevent unstable supply voltage of several volts from being transmitted to the internal components of a semiconductor chip and enhance high integration and electrical characteristics thereof.

To achieve the above object, the invention provides a high voltage cut-off semiconductor device including an electrostatic discharge protection circuit that is formed on a current path between supply power terminal and an internal circuit of a semiconductor chip to prevent unstable supply voltage of more than several volts from being transmitted to the internal circuit when the unstable supply voltage is applied from the supply power terminal, the semiconductor device comprising: constant voltage means formed on a current path between said electrostatic discharge protection circuit and the internal circuit and for preventing unstable voltage of several volts that is not cut off by said electrostatic discharge protection circuit from being sent to the internal circuit.

As another aspect of the present invention, a high voltage cut-off semiconductor device including an electrostatic discharge protection circuit that is formed on a current path between supply power terminal and an internal circuit of a semiconductor chip to prevent unstable supply voltage of more than several volts from being transmitted to the internal circuit when the unstable supply voltage is applied from the supply power terminal, the semiconductor device comprising: a semiconductor substrate; a P well doped with P type impurities on a predetermined portion of the semiconductor substrate; an $N^+$ region doped with N type impurities of high concentration on a predetermined portion of said P well; a first insulating layer having a plurality of contact holes exposing predetermined portions of said $N^+$ region and P well; first and second polysilicon layers patterned on said first insulating layer and having a desired resistance regulated by ion-implantation; a second insulating layer having a plurality of contact holes exposing the contact holes of said first insulating layer and outermost ends of said first and second polysilicon layers; and a conductive layer connecting respectively, through the contact holes of said second insulating layer, said electrostatic discharge protection circuit with said first polysilicon layer, said first polysilicon layer, $N^+$ region, and second polysilicon layer with each other, and said second polysilicon layer, P well and ground power terminal with each other.

DETAILED DESCRIPTION OF A PREFERRED EMBODIMENT

Now, a preferred embodiment of the invention will be described with reference to FIGS. 2 to 4 of the drawings.

Figure 2:
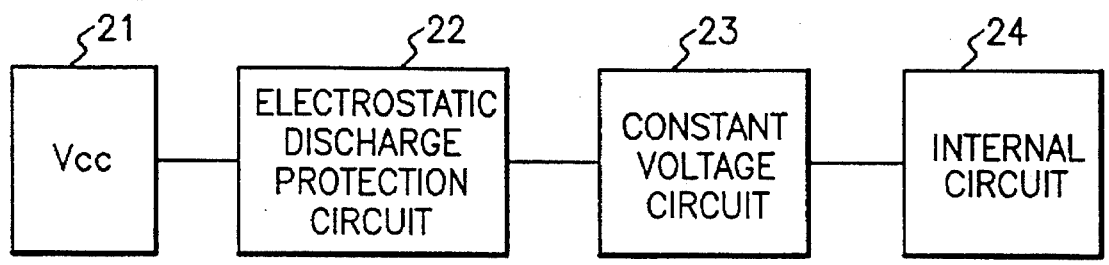
FIG. 2 is a schematic block diagram of a semiconductor chip according to the present invention.

FIG. 2 is a block diagram of a semiconductor chip in accordance with the present invention. As shown in FIG. 2, supply voltage Vcc of a supply power terminal 21 is transmitted to an internal circuit 24 via an electrostatic discharge protection circuit 22 and a constant voltage circuit 23. In case that the voltage provided from the supply power terminal 21 is an unstable supply voltage of more than tens volts, the voltage is cut off by the electrostatic discharge protection circuit 22, and unstable voltage of several volts is cut off in the constant voltage circuit 23 to protect the internal circuit 24.

Figure 3:
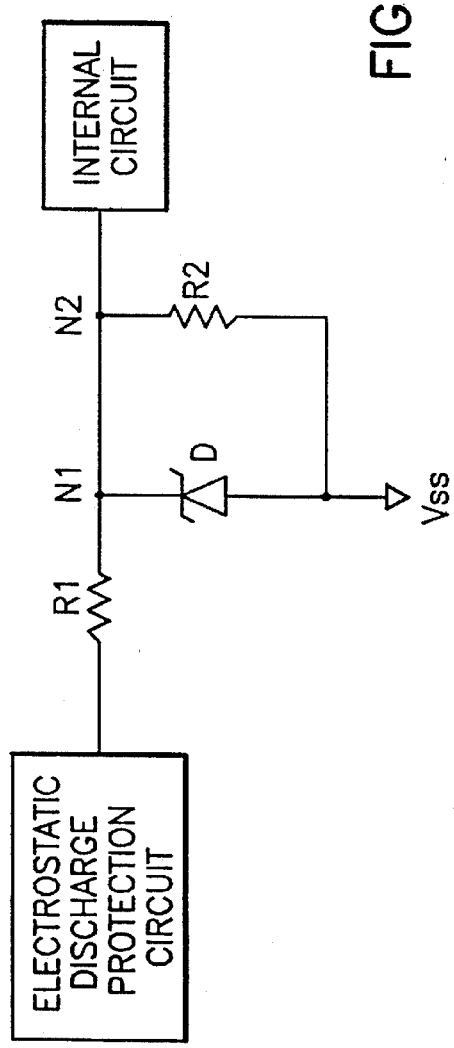
FIG. 3 is a circuit diagram of a constant voltage circuit according to a preferred embodiment of the present invention.

FIG. 3 is a circuit diagram of the constant voltage circuit in accordance with a preferred embodiment of the present invention. As shown in FIG. 3, nodes N1 and N2 are formed on the current path connecting the electrostatic discharge protection circuit with the internal circuit, and a zener diode is formed, which cathode thereof is connected to the node N1 and anode thereof is connected to ground potential Vss.

Figure 1:
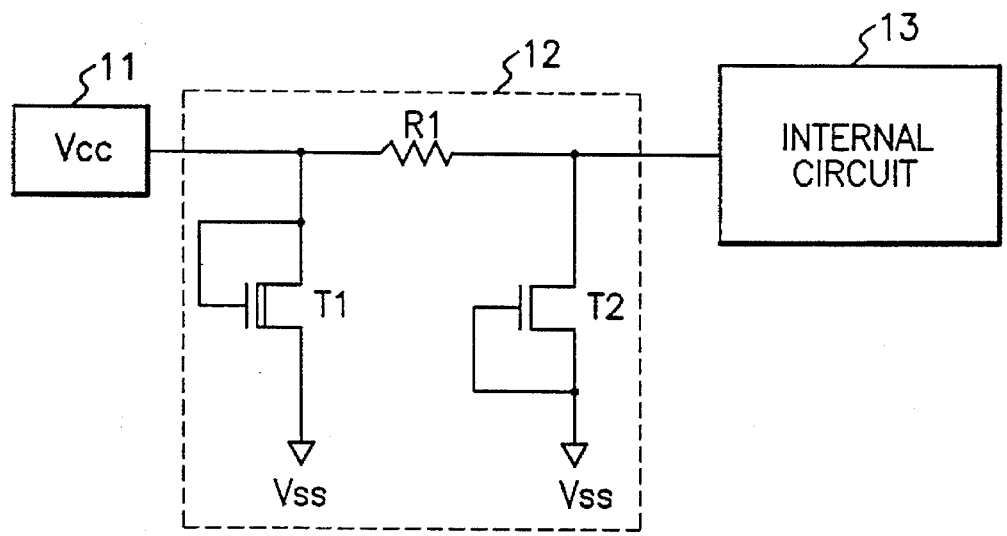
FIG. 1 is a block diagram of a semiconductor chip according to a conventional art.

Besides, resistor R1 is formed on the current path between the electrostatic discharge protection circuit and the node N1, and resistor R2 is formed between the current path between the zener diode D and ground power Vss and the node N2. At this point, the electrostatic discharge protection circuit is like as shown in FIG. 1, and the description of the circuit is omitted because it has been already made above.

In such the constant voltage circuit the zener diode D is designed to operate at more than 7 V, and if stable supply voltage, e.g. 5 V is applied to the circuit, the zener diode D is off so that the supply voltage is applied to the internal circuit intact. If the supply voltage becomes unstable and high voltage off more than 7 V is applied to the circuit, the zener diode D is turned on by breakdown characteristics to drop the voltage applied to the internal circuit thereby protecting the internal circuit against high supply voltage.

If the zener diode D is on and a voltage drop occurs to be 5 V, the zener diode D is again turned-off to supply 5 V to the internal circuit.

This description of the preferred embodiment of the present invention is about 4M and 16M integration devices using 5 V as stable supply voltage, and according to gradual high integration of the semiconductor devices, when supply voltage of 3.3 V or less is required, the performance voltage of the zener diode is designed to be below 7 V to protect the internal circuit.

Figure 4:
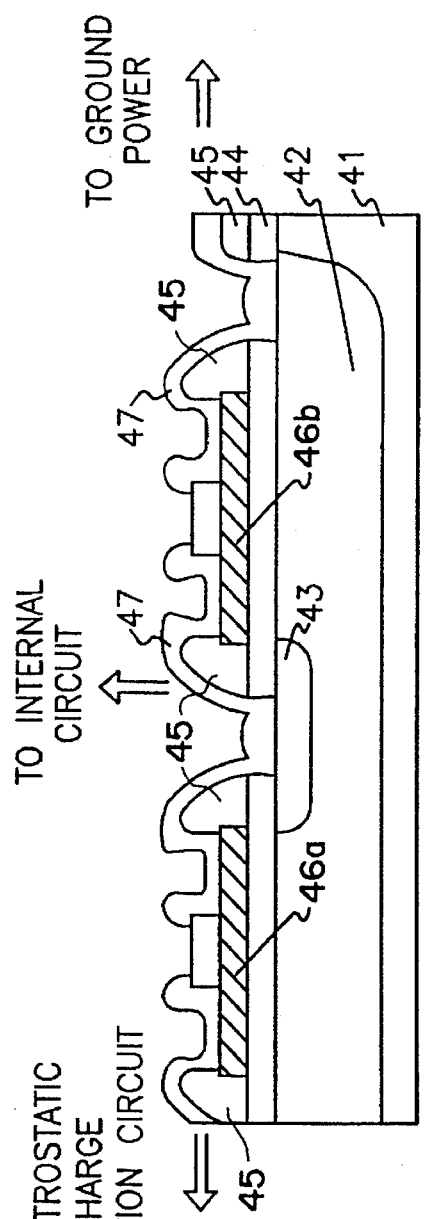
FIG. 4 is a sectional view of a constant voltage circuit in the preferred embodiment of the invention.

FIG. 4 is a sectional view depicting how such a constant voltage circuit is installed in the inside of the semiconductor chip and the structure and a fabrication method of the constant voltage circuit will be described with reference to FIG. 4.

The constant voltage circuit includes a P well 42 formed on a predetermined portion of the surface of a semiconductor substrate 41, an $N^+$ region 43 formed on a predetermined portion the surface of the P well 42, an oxide layer 44 having contact holes which predetermined portions of the P well 42 and $N^+$ region 43 are exposed through, first and second polysilicon layers 46a and 46b patterned on the oxide layer 44 having a desired resistance regulated by ion-implantation, a borophosphosilicate glass (BPSG) layer 45 having contact holes which the contact holes of the oxide layer 44 and outermost ends of the first and second polysilicon layers 46a and 46b are exposed through, a metal layer 47 which connects respectively, through the contact holes of the BPSG layer, the electrostatic discharge protection circuit with one end of the first polysilicon layer 46a, the other end of the first polysilicon layer with one end of the second polysilicon layer 46b and the $N^+$ region 43, and the other end of the second polysilicon layer 46b, P well 42 and ground power term.

In this structure, the $N^{30}$ region 43 and P well 42 show NP diode constituent, and the first and second polysilicon layers 46a and 46b show resistance constituent.

The steps in the manufacture of the voltage regulator circuit are as follows.

For starters, a P well 42 is formed on a semiconductor substrate 41 by masking process and ion-implantation, and a $N^+$ junction layer 43 is formed on the P well 42.

After that, an oxide layer 44 and a polysilicon layer 46 are successively deposited, and ion-implantation process for implanting ions into the polysilicon layer 46 to controll a desired resistance of the polysilicon layer 46, is carried out. Subsequently, a polysilicon layer 46 is subjected to masking process and etching process to from the polysilicon pattern, and a BPSG layer 45 as an insulating layer for planarization is formed over the whole surface of the resultant structure is subjected to metal contact kasking process and etching process to exposure predetermined portions of the $N^+$ junction layer 43 and P well 42 and a predetermined portion of the polysilicon pattern.

Annealing process is performed thereon, and a metal layer 47 is formed over the whole surface of the resultant structure. Masking and etching processes are performed to complete a metal pattern.

In the above structure, the polysilicon layer 46 having a resistance regulated by ion-implantation is a resistance constituent, and the $N^+$ junction layer 43 and P well 42 show NP diode constituent. This $N^+$/P-well structure is designed to operate at more than 7 V.

As mentioned above, the present invention can prevent unstable supply voltage Vcc of several volts that is not cut off by the electrostatic discharge protection circuit from being applied to the internal circuit, and allows the stable supply voltage to be applied to the internal circuit to enhance the characteristics of the semiconductor devices by using a constant voltage circuit having a zener diode. According to this invention, it is possible to shorten the channel length of the transistors forming the internal circuit to have a great effect on the high integration of the semiconductor devices.

Although the preferred embodiments of the invention have been disclosed for illustrative purpose, those skilled in the art will appreciate that various modifications, additions and substitutions are possible, without departing from the scope and spirit of the invention as disclosed in the accompanying claims.

What is claimed is:

1. A high voltage cut-off semiconductor device including an electrostatic discharge protection circuit that is formed on a current path between supply power terminal and an internal circuit of a semiconductor chip to prevent unstable supply voltage of more than several volts from being transmitted to the internal circuit when the unstable supply voltage is applied from the supply power terminal, the semiconductor device comprising:

constant voltage means formed on a current path between said electrostatic discharge protection circuit and internal circuit for preventing unstable voltage of several volts that is not cut off by said electrostatic discharge protection circuit from being sent to the internal circuit, wherein said constant voltage means further comprises:

nodes formed on said current path;

a first power terminal supplying a predetermined voltage;

first resistor means formed on the current path between said electrostatic discharge protection circuit and one of said nodes;

a constant-voltage diode formed between one of said nodes and the first power terminal and turned on to drop voltage of said node into a predetermined stable voltage in case that said voltage of said node is unstable voltage of more than several volts; and second resistor means formed parallel to said constant voltage diode between the other of said nodes and first power terminal.

2. The semiconductor device according to claim 1, wherein said constant-voltage diode is turned on at more than 7 V.

3. The semiconductor device according to claim 2, said first power terminal is ground power.

4. A high voltage cut-off semiconductor device including an electrostatic discharge protection circuit that is formed on a current path between supply power terminal and an internal circuit of a semiconductor chip to prevent unstable supply voltage of more than several volts from being transmitted to the internal circuit when the unstable supply voltage is applied for the supply power terminal, the semiconductor device comprising:

a semiconductor substrate;

a P well doped with P type impurities on a predetermined portion of the semiconductor substrate;

an $N^+$ region doped with N type impurities of high concentration on a predetermined portion of said P well;

a first insulating layer having a plurality of contact holes exposing predetermined portions of said $N^+$ region and P well first and second polysilicon layers patterned on said first insulating layer and having a desired resistance regulated ion-implantation;

a second insulating layer having a plurality of contact holes exposing the contact holes of said first insulating layer and the ends of said first and second polysilicon layers;

a first conductive layer connecting, through the contact holes of said second insulating layer, said electrostatic discharge protection circuit with one end of said first polysilicon layer;

a second conductive layer connecting the other end of said first polysilicon layer with $N^+$ region and one end of the second polysilicon layer; and a third conductive layer connecting the other end of said second polysilicon layer with P well and ground power terminal.

5. The semiconductor device according to claim 4, wherein said first insulating layer is an oxide layer.

6. The semiconductor device according to claim 4, wherein said second insulating layer is an insulating layer for planarization.

7. The semiconductor device according to claim 4, wherein said conductive layer is a metal layer.

* * * * *